US011264393B2

United States Patent
Chen et al.

(10) Patent No.: US 11,264,393 B2
(45) Date of Patent: Mar. 1, 2022

(54) SOURCE/DRAIN CONTACT HAVING A PROTRUDING SEGMENT

(71) Applicant: Taiwan Semiconductor Manufacturing Co., Ltd., Hsin-Chu (TW)

(72) Inventors: Jui-Lin Chen, Taipei (TW); Chao-Yuan Chang, New Taipei (TW); Ping-Wei Wang, Hsin-Chu (TW); Fu-Kai Yang, Hsinchu (TW); Ting Fang, Kaohsiung (TW); I-Wen Wu, Hsinchu (TW); Shih-Hao Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 66 days.

(21) Appl. No.: 16/776,205

(22) Filed: Jan. 29, 2020

(65) Prior Publication Data
US 2021/0098468 A1    Apr. 1, 2021

Related U.S. Application Data

(60) Provisional application No. 62/908,203, filed on Sep. 30, 2019.

(51) Int. Cl.
| *H01L 27/11* | (2006.01) |
| *H01L 29/417* | (2006.01) |
| *H01L 23/522* | (2006.01) |
| *H01L 21/768* | (2006.01) |
| *H01L 21/02* | (2006.01) |
| *H01L 29/40* | (2006.01) |

(52) U.S. Cl.
CPC .... *H01L 27/1104* (2013.01); *H01L 21/02063* (2013.01); *H01L 21/76816* (2013.01); *H01L 21/76831* (2013.01); *H01L 23/5226* (2013.01); *H01L 29/401* (2013.01); *H01L 29/41791* (2013.01)

(58) Field of Classification Search
CPC ............. H01L 29/41766; H01L 29/165; H01L 29/7397; H01L 27/1108; H01L 27/1104; H01L 21/26586
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |

(Continued)

FOREIGN PATENT DOCUMENTS

JP        2007067371 A      3/2007

*Primary Examiner* — Zandra V Smith
*Assistant Examiner* — John M Parker
(74) *Attorney, Agent, or Firm* — Haynes and Boone, LLP

(57) ABSTRACT

A semiconductor device includes a fin structure. A source/drain region is formed on the fin structure. A first gate structure is disposed over the fin structure. A source/drain contact is disposed over the source/drain region. The source/drain contact has a protruding segment that protrudes at least partially over the first gate structure. The source/drain contact electrically couples together the source/drain region and the first gate structure.

20 Claims, 16 Drawing Sheets

(56) References Cited

U.S. PATENT DOCUMENTS

| | | |
|---|---|---|
| 9,064,931 B2 * | 6/2015 | Hung .................. H01L 21/76816 |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2007/0023832 A1 | 2/2007 | Matsui |
| 2014/0035056 A1 | 2/2014 | Liaw |
| 2014/0346575 A1 * | 11/2014 | Chen .................. H01L 29/0692 257/288 |
| 2015/0060960 A1 * | 3/2015 | Xie .................. H01L 29/41791 257/288 |
| 2015/0137194 A1 * | 5/2015 | Wei .................. H01L 21/76897 257/288 |
| 2017/0194211 A1 | 7/2017 | Lai et al. |
| 2017/0373161 A1 | 12/2017 | Schroeder |
| 2018/0076139 A1 | 3/2018 | Liu et al. |
| 2018/0151718 A1 | 5/2018 | Chen et al. |

\* cited by examiner

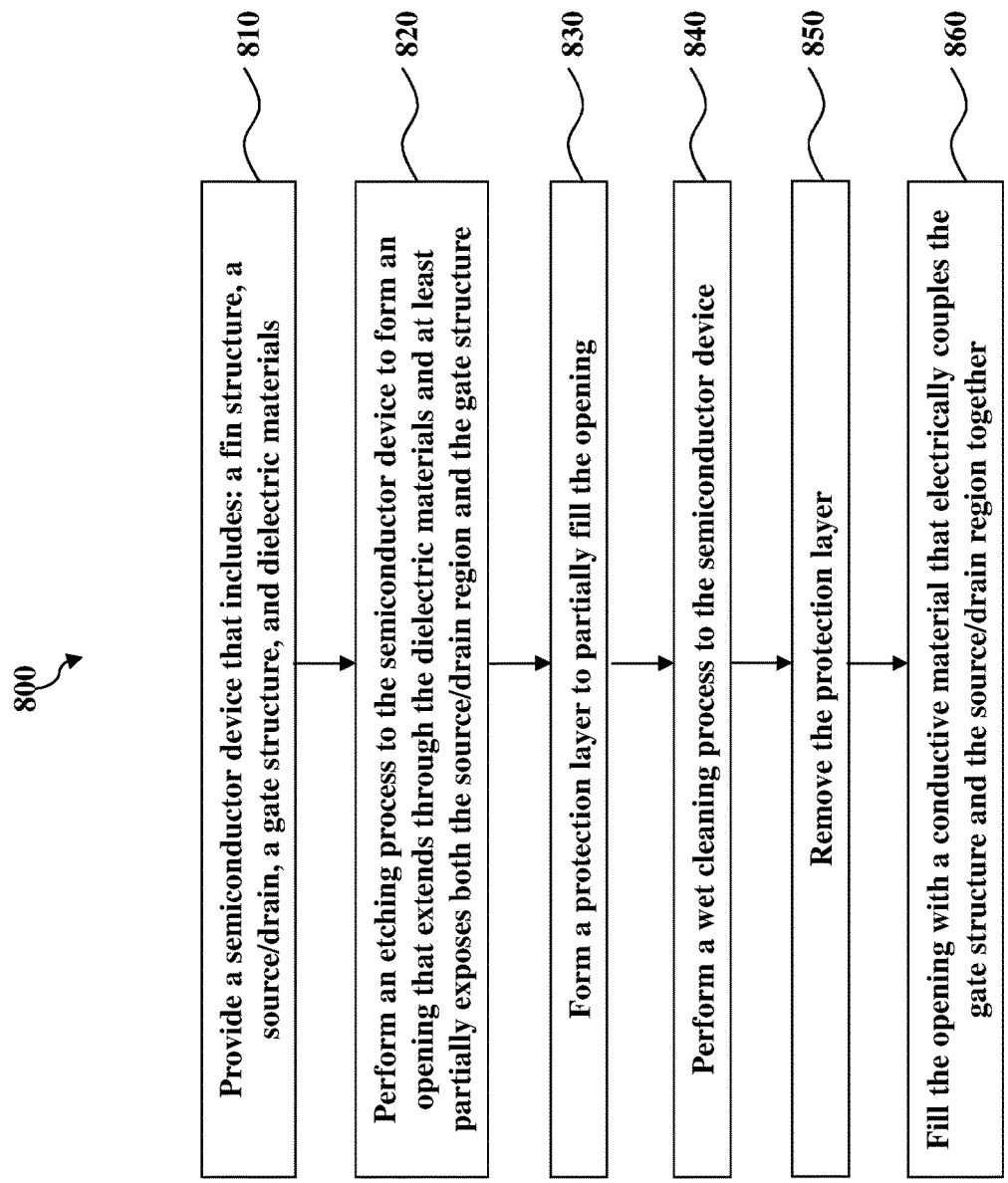

SOURCE/DRAIN CONTACT HAVING A PROTRUDING SEGMENT

PRIORITY DATA

This is a utility application which claims the benefit of U.S. Provisional Patent Application No. 62/908,203 filed Sep. 30, 2019, entitled "Source/Drain Contact Having a Protruding Segment", the disclosure of which is hereby incorporated by reference in its entirety.

BACKGROUND

In deep sub-micron integrated circuit technology, an embedded static random access memory (SRAM) device has become a popular storage unit of high speed communication, image processing and system-on-chip (SOC) products. The amount of embedded SRAM in microprocessors and SOCs increases to meet the performance requirement in each new technology generation. As silicon technology continues to scale from one generation to the next, parasitic effects may be impacting SRAM device performance more and more. For example, parasitic resistance may become a greater factor as semiconductor feature sizes continue to shrink, which may degrade a minimum operating voltage (Vmin) of an SRAM cell. This may lead to sub-par SRAM performance or even device failures.

Therefore, although existing SRAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 15 illustrates a flow of fabricating a semiconductor device according to an embodiment of the present disclosure.

DETAILED DESCRIPTION

Figure 1:
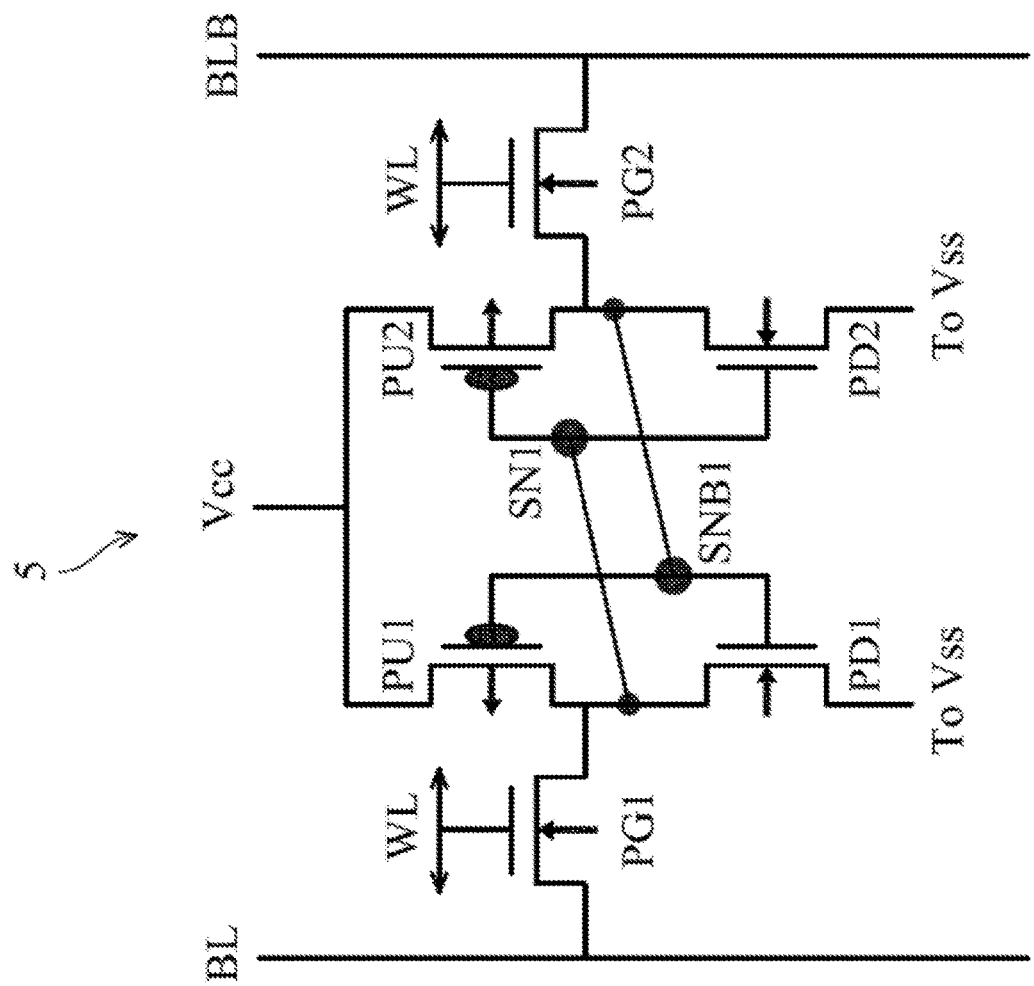
FIG. 1 illustrates a circuit schematic for a 1-bit SRAM cell according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a static random access memory (SRAM) device. An SRAM device is a type of semiconductor memory that uses bi-stable latching circuitry (e.g., flip-flop) to store binary bits of information. FIG. 1 illustrates an example circuit schematic for a single-port SRAM cell (e.g., 1-bit SRAM cell) 5. The single-port SRAM cell 5 includes pull-up transistors PU1, PU2; pull-down transistors PD1, PD2; and pass-gate transistors PG1, PG2. As show in the circuit diagram, transistors PU1 and PU2 are p-type transistors, such as the p-type FinFETs discussed above, and transistors PG1, PG2, PD1, and PD2 are n-type FinFETs discussed above. Since the SRAM cell 5 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL.

SRAM devices such as the SRAM cell 5 may be implemented using "planar" transistor devices and/or with FinFET devices. In that regard, a FinFET device is a fin-like field-effect transistor device, which has been gaining popularity recently in the semiconductor industry. FinFET devices offer several advantages over traditional Metal-Oxide Semiconductor Field Effect Transistor (MOSFET) devices (e.g., "planar" transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

The FinFET device may be a complementary metal-oxide-semiconductor (CMOS) device including a P-type metal-oxide-semiconductor (PMOS) FinFET device and an N-type metal-oxide-semiconductor (NMOS) FinFET device. It is understood that some aspects of the following disclosure may be discussed using FinFET devices as examples, but it is understood that the application is not limited to FinFET devices, except as specifically claimed.

Figure 2:
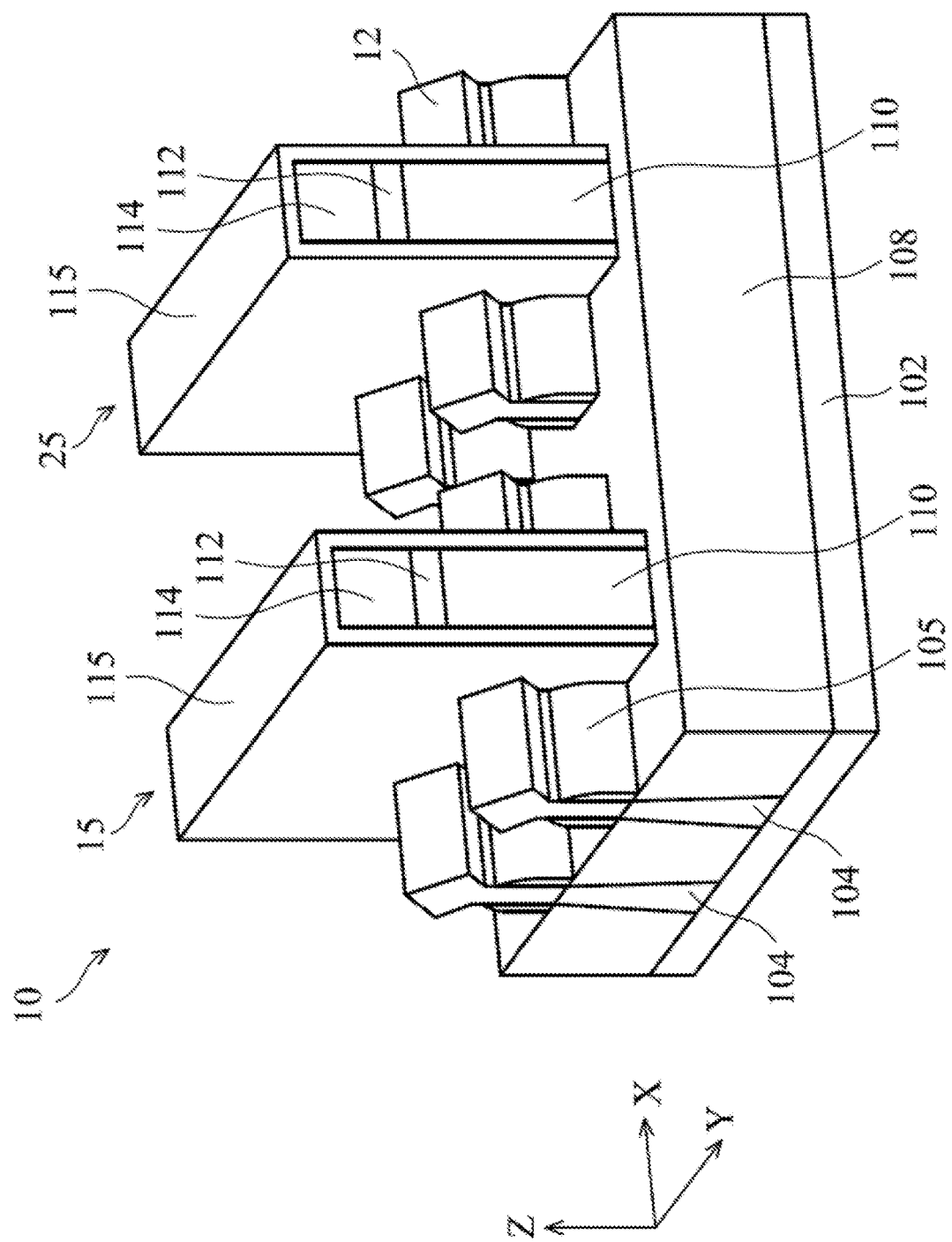
FIG. 2 illustrates a perspective three-dimensional view of a FinFET device according to an embodiment of the present disclosure.

Referring to FIG. 2, a perspective view of an example FinFET device 10 is illustrated. The FinFET device structure 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structure 104 is elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a multiple patterning lithography process, such as a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 2. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114. In at least one embodiment, the dielectric layer 115 is directly in contact with the gate electrode 110.

The gate dielectric layer (not shown in FIG. 2 herein) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

Figure 3:
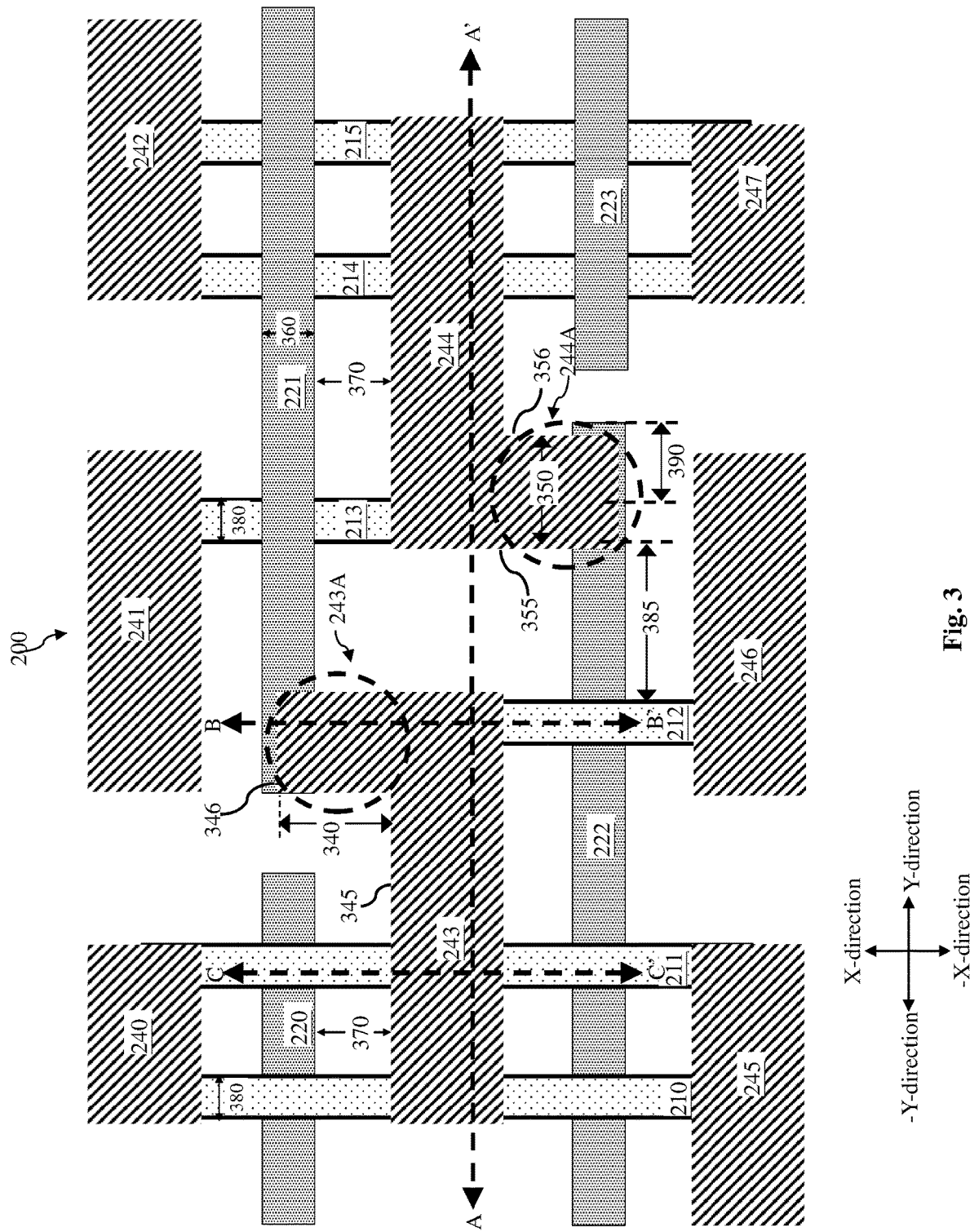
FIG. 3 illustrates a top view layout of a portion of an SRAM cell array according to an embodiment of the present disclosure.

FIG. 3 illustrates a top view of a portion of an SRAM cell array 200 that is implemented using FinFETs according to embodiments of the present disclosure. The top view of FIG. 3 is defined by an X-axis (spanning alone the X-direction of FIG. 2) and a Y-axis (spanning alone the Y-direction of FIG. 2). Note that the X-axis is the vertical axis in FIG. 3, and the Y-axis is the horizontal axis in FIG. 3. Also note that the top view shown in FIG. 3 may correspond to an idealized top view of the SRAM cell array 200. For example, the various components shown in FIG. 3 may have straight edges or are shaped as rectangles or polygons. In actually fabricated devices, the components in FIG. 3 may have more rounded, curved, or otherwise non-straight edges. In some embodiments, the top view of FIG. 3 may correspond to the top view of the patterns on one or more photomasks that are used to form the SRAM cell array 200, as the patterns on lithography masks do have more straight edges and resemble the rectangles or polygons more closely than the patterns on an actually fabricated device. In other embodiments, the top view of FIG. 3 may represent the top view of the portion of the actually fabricated SRAM cell array 200, with the understanding that the edges and contours of the actually fabricated SRAM cell array 200 not being perfectly linear or straight.

The SRAM cell array 200 includes a plurality of SRAM cells, for example SRAM cells such as the SRAM cell 5 (e.g., the 6 T SRAM cell) of FIG. 1. The SRAM cell array 200 may be implemented at least in part using a plurality of fin structures, such as fin structures 210-215, which may each be an embodiment of the fin structure 104 of FIG. 2. The fin structures 210-215 each extend in an elongated manner in the X-direction. The fin structures 210-215 may also be referred to as active regions. Source/drain regions and/or channel regions of transistors may be formed on, or as a part of, the fin structures 210-215.

The SRAM cell array 200 also includes a plurality of gate structures, such as gate structures 220-223, which may each be implemented as an embodiment of the gate structures of FIG. 2 (depending on whether the gate structure is for an NFET or a PFET). The gate structures 220-223 may each include a high-k gate dielectric and a metal gate electrode. In other words, the gate structures 220 may each be a HKMG structure. The gate structures 220-223 may each wrap around one or more of the fin structures 210-215, but in the top view of FIG. 3, the gate structures 220-223 are illustrated as extending in the Y-direction that is perpendicular to the X-direction in which the fin structures 210-215 each extend.

The fin structures 210-215 and the gate structures 220-223 may form transistors. For example, in an embodiment, the pull-up (PU) transistors of the SRAM cell 5 are formed by the transistors in an N-doped region, and the pull-down (PD) transistors and the pass-gate (PG) transistors are formed by the transistors in a P-doped region.

It is understood that some of the gate structures 220-223 may be separated from one another by isolation structures, also referred to as cut-metal-gate (CMG) structures. For example, the gate structure 220 and the gate structure 221 may have been formed initially as a single continuous gate structure, and then "broken up" or "severed" by a CMG structure. The same may be true for the gate structures 222-223. In other words, a CMG structure may be disposed between the gate structures 220-221 in the Y-direction, and another CMG structure may be disposed between the gate structures 222-223 in the Y-direction. For reasons of simplicity, however, the CMG structures are not specifically illustrated in FIG. 3.

The SRAM cell array 200 includes a plurality of source/drain contacts, such as source/drain contacts 240-247. The source/drain contacts 240-247 are formed on, and provide electrical connectivity to, source/drain regions of transistors. The source/drain contacts 240-247 mostly extend in the Y-direction. However, a subset of the source/drain contacts 240-247 may also have a protruding segment that protrudes in the X-direction. For example, a majority portion (e.g., greater than 50%) of the source/drain contact 243 extends in the Y-direction, but it also has a protruding segment 243A that protrudes out in the X-direction, such that the source/drain contact 243 has a top view profile that resembles the letter "L". Similarly, most of the source/drain contact 244 extends in the Y-direction, but it also has a protruding segment 244A that protrudes out in the −X-direction. The protruding segment 243A at least partially overlaps with the gate structure 221 in the top view, and the protruding segment 244A at least partially overlaps with the gate structure 222 in the top view. As will be more readily apparent in a cross-sectional view of the SRAM cell array 200 discussed below, the protruding segment 243A is electrically connected to the gate structure 221, and the protruding segment 244A is electrically connected to the gate structure 222.

The implementation of source/drain contacts with the protruding segments (such as the protruding segments 243A and 244A) is a unique aspect of the present disclosure. In conventional SRAM cell arrays, the source/drain contacts extend in just a single direction (e.g., just the Y-direction) and do not have protruding segments. Those source/drain contacts are not used to provide electrical connectivity to the gate structures. Instead, the gate structures and the source/drain contacts in a conventional SRAM cell array may be electrically connected together using a butted contact that is formed on the source/drain contacts and on the gate structures. In other words, a portion of such a butted contact may be electrically connected to a source/drain contact, while another portion of such a butted contact may be electrically connected to a gate structure.

Unfortunately, the presence of these butted contacts may constrict the lateral position or size of metal lines that are formed thereover. This is explained with more clarity with reference to FIG. 4, which is a diagrammatic fragmentary cross-sectional side view of a portion of the SRAM cell array, with the cross-section cut taken along a cutline A-A' in the top view of FIG. 3. The cross-sectional view of FIG. 4 corresponds to a plane defined by the Y-direction (horizontal direction) and the Z-direction (vertical direction).

Figure 4:
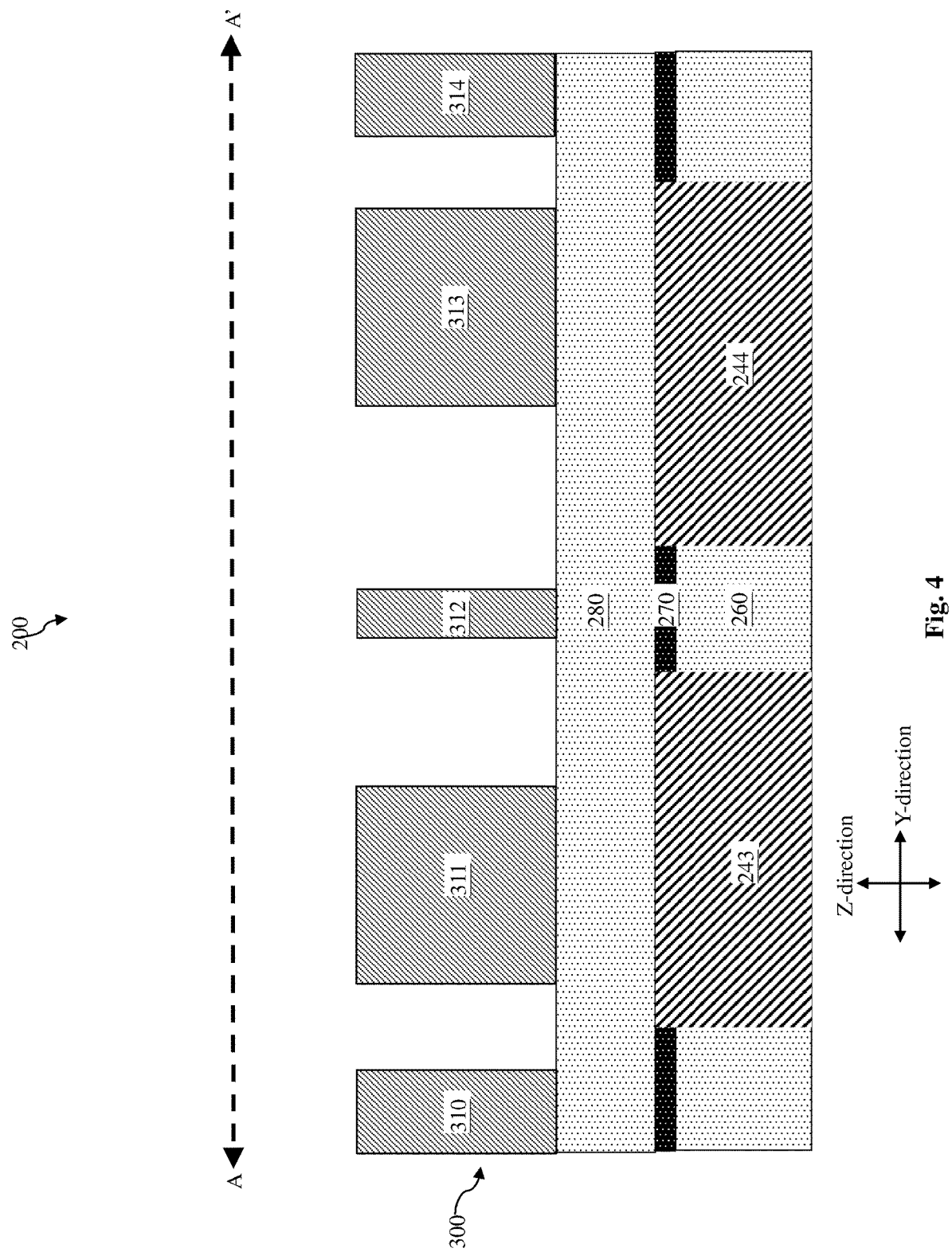
FIGS. 4-13 illustrate a series of cross-sectional side view of a portion of an SRAM cell array at various stages of fabrication according to an embodiment of the present disclosure.

As shown in FIG. 4, the source/drain contacts 243 and 244 are disposed in, or surrounded by, an interlayer dielectric (ILD) 260, also referred to as an ILD0 layer. The ILD 260 surrounds electrically conductive components (such as the source/drain contacts 243-244) and provides electrical isolation for the conductive components. In some embodiments, the ILD may include a low-k dielectric material (e.g., a dielectric material having a dielectric constant that is smaller than a dielectric constant of silicon dioxide, which is about 4). As non-limiting examples, the low-k dielectric material may include a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on organic polymeric dielectrics, spin-on silicon based polymeric dielectrics, or combinations thereof.

An etching stop layer 270 is formed over the ILD 260. The etching stop layer 270 and the ILD 260 may have different material compositions. Another ILD 280 (also referred to as an ILD1 layer) is disposed over the etching stop layer 270. The ILD 280 may have a substantially similar material composition as the ILD 260. In conventional SRAM cell arrays, butted contacts (that electrically interconnect source/drain contacts and gate structures) may be embedded in the ILD 280. However, it can be seen in FIG. 4 that the SRAM cell array 200 lacks such butted contacts in the ILD 280. Instead, the protruding source/drain contacts 243-244 provide the functionalities of the butted contacts.

A multi-layer interconnect (MLI) structure is formed over the ILD 280. The MLI structure may be formed over a substrate and may include a plurality of patterned dielectric layers and conductive layers that provide interconnections (e.g., wiring) between the various microelectronic components of a semiconductor device (e.g., the SRAM cell array 200). For example, the MLI structure may include a plurality of conductive components, for example contacts, vias, or metal lines. The metal lines may be disposed in a plurality of metal layers that are stacked over one another vertically, and the vias are used to electrically interconnect the metal lines from different layers together. The metal lines and vias may provide electrical connectivity to transistor components such as gate, source, and/or drain. The conductive components may contain conductive materials such as aluminum, aluminum/silicon/copper alloy, titanium, titanium nitride, tungsten, polysilicon, metal silicide, or combinations thereof. Alternatively, the conductive components may include copper, copper alloy, titanium, titanium nitride, tantalum, tantalum nitride, tungsten, polysilicon, metal silicide, or combinations thereof. For reasons of simplicity, a metal layer 300 (also referred to as an M0 layer) of the MLI structure is shown in FIG. 4, while the other metal layers above the metal layer 300 are omitted in FIG. 4.

As examples, the metal layer 300 includes a plurality of metal lines 310-314. The metal lines 310-314 each extend in an elongated manner in the X-direction of FIGS. 2-3. In other words, each of the metal lines 310-314 extends orthogonally to the Y-Z plane. Some of the metal lines 310-314 may serve as the signal lines of the SRAM cell array 200. For example, the metal lines 311 and 313 may serve as the bit line (BL) or the bit line bar (BLB) (see FIG. 1) of the SRAM cell array 200. The metal lines 311 and 313 may each extend continuously through multiple SRAM cells. As an electrical conductor, ideally the metal lines 311 and 313 should have substantially zero electrical resistance. However, in real world devices, each of the metal lines 311 and 313 may generate a parasitic electrical resistance that is a function of its size (e.g., both a length in the X-direction and a width in the Y-direction). For example, as the width (e.g., lateral dimension measured in the Y-direction) of the metal line 311 or 313 decreases, the parasitic electrical resistance may increase. In old technology generations that are greater than the 5-nanometer technology generation, such a parasitic electrical resistance may be somewhat negligible, since the dimensions of the metal lines may be sufficiently large.

However, as the device scaling down trend continues to shrink the dimensions of microelectronic components (e.g., including the dimensions of the metal lines 311 and 313), the parasitic electrical resistance of the metal lines 311 or 313 may rise to a level that is no longer negligible but that could significantly degrade the performance of a semiconductor device. For example, according to Ohm's law, a voltage drop across a length of a resistor is equal to an electrical current running through the resistor multiplied by the electrical resistance of the resistor. This relationship between voltage and resistance may be mathematically expressed as $V=I*R$, where V represents voltage, I represents electrical current, and R represents electrical resistance.

In the case at hand, each of the metal lines 311 and 313 may be modeled as a resistor (due to its parasitic resistance). As such, each of the metal lines 311 and 313 may experience a voltage drop across the length thereof (in the X-direction) during an operation of the SRAM cell array 200. This voltage drop may degrade certain SRAM operating parameters or criteria, such as a minimum operating voltage (hereinafter referred to as Vmin). In some cases, the degradation of the Vmin may be in a range from about 5 milli-volts (mV) to about 200 mV. If Vmin is not satisfied, a SRAM cell may experience read failures, write failures, access failures, and/or retention failures. To exacerbate the problem, the device scaling-down process may also be accompanied by the need to scale down the SRAM supply voltages (e.g., Vdd). Since the Vmin may be correlated with supply voltages, the scaling down of supply voltages may further reduce the margin of error (or the amount of degradation) that the Vmin can experience.

In order to reduce parasitic resistance, it may be desirable to enlarge the lateral dimension of the metal lines 311 and 313 in the Y-direction. However, in conventional SRAM cell arrays, the existence of the butted contact in the ILD 280 could have prevented the lateral enlargement of the metal lines 311 or 313. For example, if a butted contact is located in the portion of the ILD 280 that is between the metal lines 312 and 313, the lateral expansion of the metal line 313 could have caused an electrical shorting between the metal line 313 and the butted contact, which could lead to device malfunctions or failures. As such, conventional SRAM cell array may have design rules that specify a minimum distance (in the Y-direction) between the butted contact and the metal lines 311 and/or 313. These design rules constrict or restrict the lateral expansion of the metal lines 311 and/or 313. This effectively places a cap on how much the metal lines 311 and/or 313 can be laterally enlarged, meaning conventional SRAM fabrication has a limit on how much the electrical resistance of the metal lines 311 and/or 313 can be reduced, since electrical resistance is inversely correlated with the size of a metal line (e.g., the larger the width of the metal lines 311 or 313, the smaller the resistance, and vice versa).

In contrast to conventional SRAM cell arrays, the SRAM cell array 200 of the present disclosure does not have butted contacts in the ILD 280, which frees up a substantial amount of room for the metal lines 311 and/or 313 to be enlarged laterally in the Y-direction. For example, in the embodiment shown in FIG. 4, the metal line 313 may be enlarged in the Y-direction toward the metal line 312, and such a lateral enlargement is restricted by the design rules specifying the spacing between the metal lines 313 and 312, rather than the spacing between the metal line 313 and the butted contact (that would have been located much closer to the metal line 313 than the metal line 312). As such, the present disclosure allows for a much more flexible resistance reduction of the metal lines (such as metal lines 311 or 313) compared to conventional SRAM devices. Again, this is made possible by replacing the butted contacts in the ILD 280 in conventional SRAM cell arrays with the uniquely-shaped source/drain contacts 243/244 (with the protruding portions) of the present disclosure.

Referring back to FIG. 3, the protruding segments 243A and 244A each have a dimension 340 that is measured in the X-direction. The dimension 340 indicates how far out the protruding segments 243A and 244A each protrude. For example, a main portion of the source/drain contact 243 has a boundary 345 that extends in the Y-direction, and the protruding segment 243A has a boundary 346 that extends in the Y-direction and overlaps with the gate structure 221 in the top view. The dimension 340 is measured from the boundary 345 to the boundary 346.

The protruding segments 243A and 244A also each have a dimension 350 that is measured in the Y-direction. The dimension 350 indicates how wide the protruding segments 243A and 244A each are. For example, the protruding segment 244A has a boundary 355 and a boundary 356 that each extend in the X-direction. The dimension 350 is measured from the boundary 355 to the boundary 356. The values of the dimensions 340 and 350 are specifically configured such that the protruding segments 243A and 244A (of the source/drain contacts 243 and 244) have a sufficient amount of contact area with the intended gate structures, so that they can effectively replace the butted contacts, but at the same time, they are not too large to cause fabrication difficulties, processing defects, or risk electrical shorting with other unintended components of the SRAM cell array 200.

According to various aspects of the present disclosure, the dimensions 340 and 350 are specifically configured to be in certain ranges in order to optimize the performance of the SRAM cell array 200. The ranges of the dimensions 340 and 350 may be defined relative to the dimensions or sizes of other components of the SRAM cell array 200. For example, the gate structures 220-223 each have a dimension 360 that is measured in the X-direction, and the gate structures 220-223 may each be separated or spaced apart from a nearest source/drain contact 243/244 by a distance 370 in the X-direction. In some embodiments, the dimension 340 is greater than about a sum of the distance 370 and ½ of the dimension 360. This may be mathematically expressed as: the dimension 340>=the distance 370+½*(the dimension 360). Meanwhile, the dimension 340 is less than about a sum of the distance 370 and the dimension 360. This may be mathematically expressed as: the dimension 340<=the distance 370+the dimension 360. Among other things, such a range for the dimension 340 helps ensure that the protruding segment 243A can make sufficient physical contact with the gate structure 221 (since it protrudes at least halfway into the gate structure 221), but it does not protrude too far so as to risk electrical shorting (also referred to as bridging) with the source/drain contact 241.

Still referring to FIG. 3, the fin structures 210-215 each have a dimension 380 that is measured in the Y-direction. The fin structure 213 is separated from the adjacent fin structure 212 by a distance 385 (also referred to as fin-to-fin spacing). The fin structure 213 is also spaced apart from the end of the gate structure 222 (or from the CMG structure that separates the gate structures 222-223) by a distance 390. Or stated differently, the gate structure 222 protrudes beyond the fin structure 213 in the Y-direction by the distance 390. In some embodiments, the dimension 350 is greater than about a sum of the distance 390 and the dimension 380. This may be mathematically expressed as: the dimension 350>=the distance 390+the dimension 380. Meanwhile, the dimension 350 is less than about a sum of: the distance 390, the dimension 380, and ½ of the distance 385. This may be mathematically expressed as: the dimension 350 <=the distance 390+the dimension 380+½*(the distance 385). Among other things, such a range for the dimension 350 helps ensure that the protruding segment 244A can make sufficient physical contact with the gate structure 222 and with the desired portions of fin structure 213, but it does not protrude too far so as to risk electrical shorting with the source/drain contact 243 or the fin structure 212.

Figure 3A:
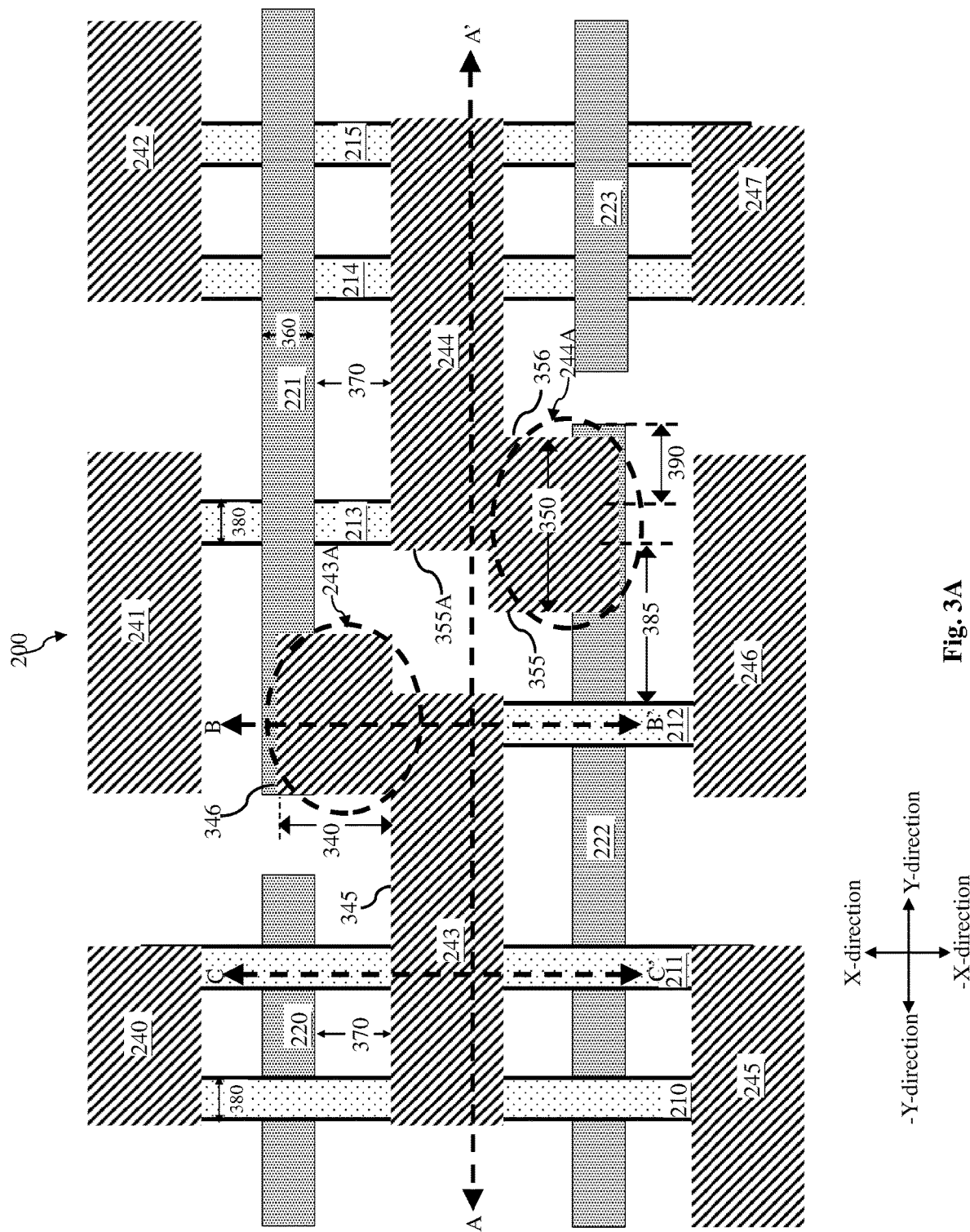
FIG. 3A illustrates a top view layout of a portion of an SRAM cell array according to another embodiment of the present disclosure.

FIG. 3A illustrates another embodiment of the SRAM cell array 200. The embodiment shown in FIG. 3A is substantially similar to the embodiment shown in FIG. 3. Therefore, for reasons of consistency and clarity, similar components are labeled the same in both of the embodiments. One difference between the embodiments is that the protruding segments 243A and 244A may protrude further out in the Y-direction in the embodiment shown in FIG. 3A compared to the embodiment shown in FIG. 3. For example, the boundary 355 of the protruding segment 244A may be pushed out further in the -Y-direction, whereas the rest of the source/drain contact 244 may still retain the boundary 355A (i.e., the same boundary as the boundary 355 in the embodiment of FIG. 3). Note that although the dimension 350 in the embodiment of FIG. 3A is greater than the dimension 350 in the embodiment of FIG. 3, the dimension 350 may still have the same range as in the embodiment shown in FIG. 3, for example it is greater than the sum of the distance 390 and the dimension 380, but less than the sum of: the distance 390, the dimension 380, and ½ of the distance 385.

Figure 5:
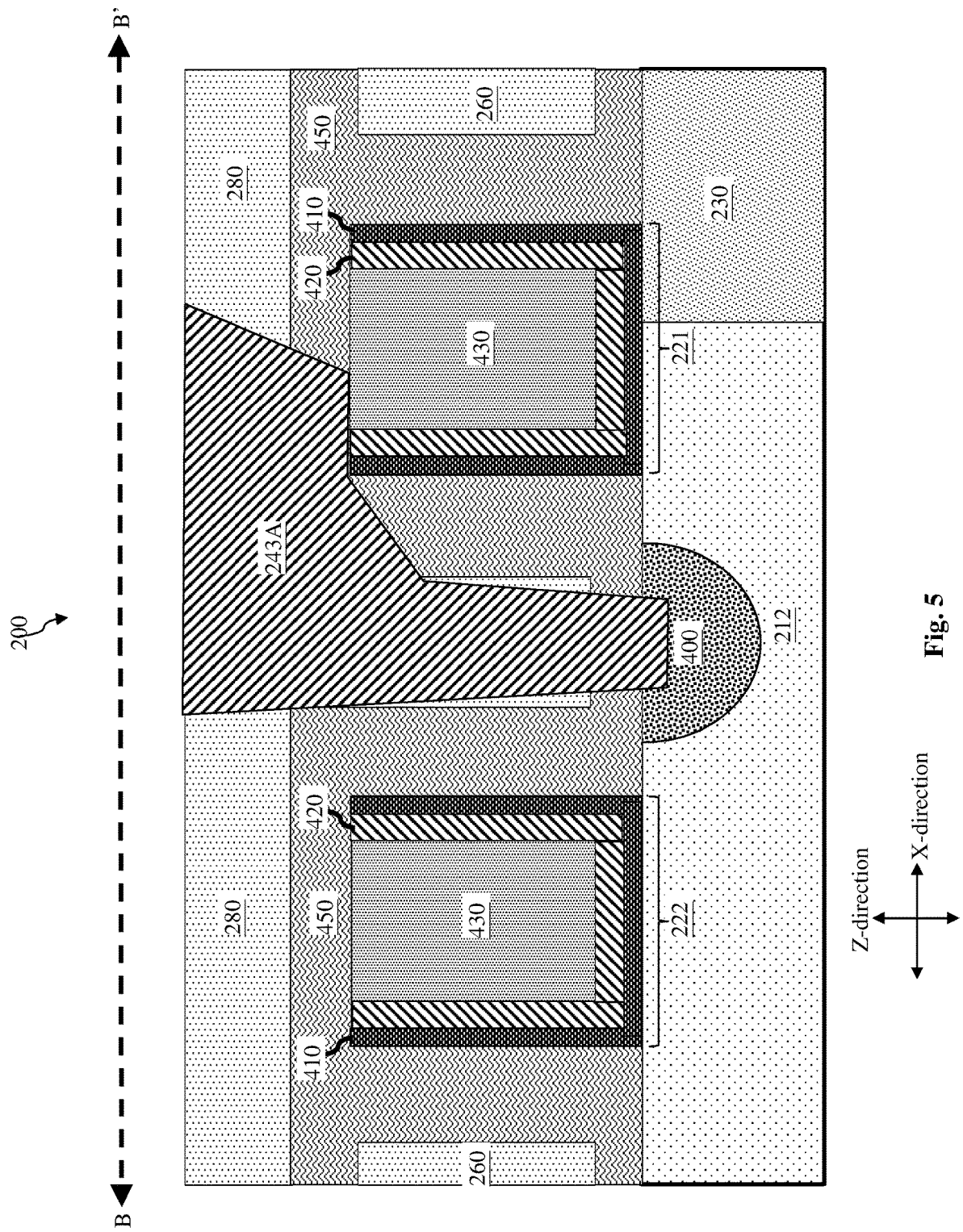
Figure 6:
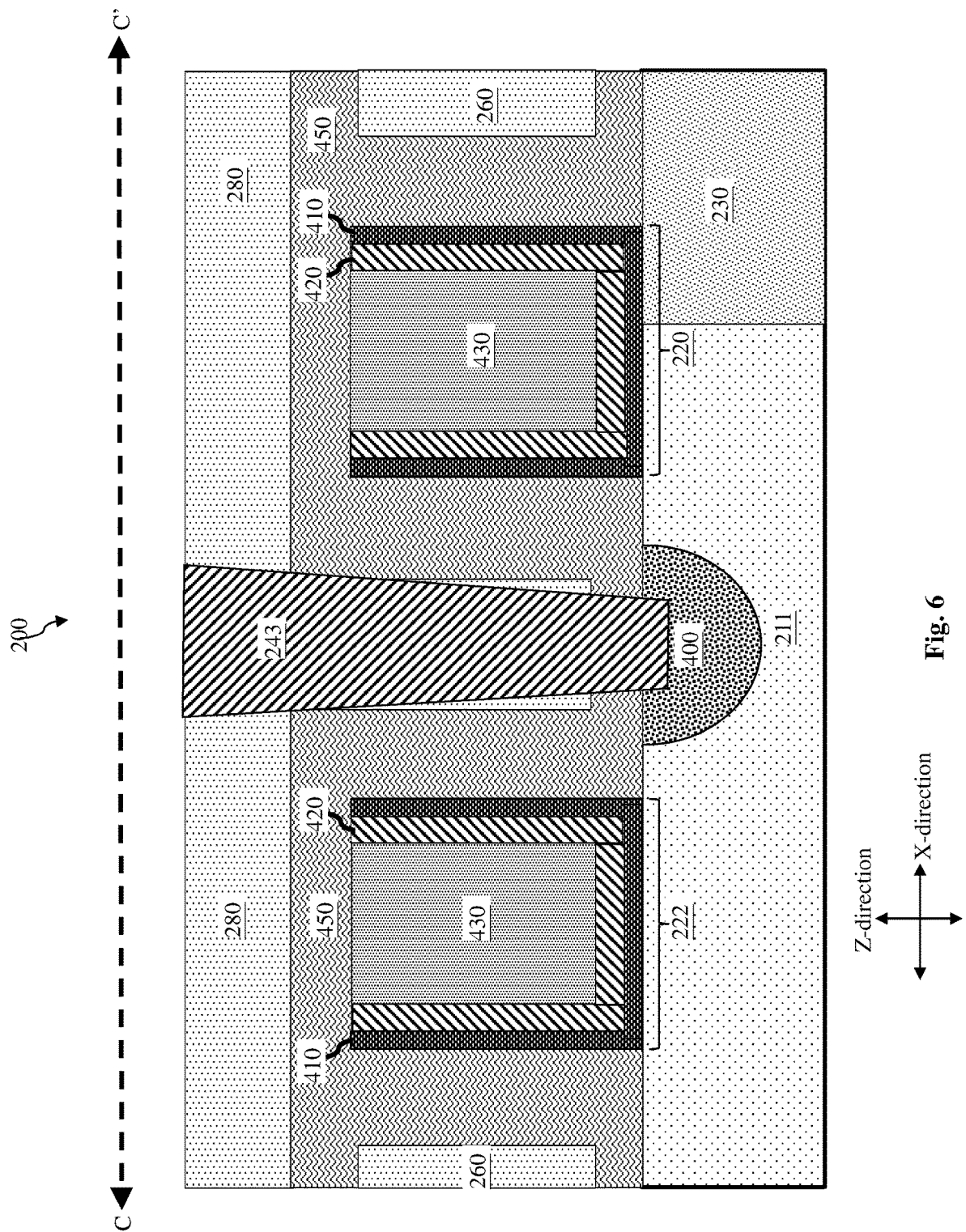

FIGS. 5-6 are diagrammatic fragmentary cross-sectional side views of portions of the SRAM cell array 200 to further illustrate the structural details of the uniquely shaped source/drain contacts 243-244 of the present disclosure. Specifically, FIG. 5 corresponds to a cross-section taken at a cutline B-B' (which includes the protruding segment 243A), and FIG. 6 corresponds to a cross-section taken at a cutline C-C' (which is a portion the source/drain contact 243 outside of the protruding segment 243A). In other words, the cross-sectional views in FIGS. 5-6 are obtained by taking the cross-sectional cut along an X-Z plane defined by the X-direction (horizontally) and the Z-direction (vertically).

As shown in FIGS. 5-6, a source/drain region 400 is formed on, or as a part of, the fin structures 211-212. For example, the source/drain region 400 may be epitaxially grown on the fin structures 211-212. The fin structures 211-212 may be abutted to an isolation structure 230, for example a shallow trench isolation (STI). In other words, the fin structures 211-212 may each be partially surrounded laterally by the isolation structure 230. The gate structures 221-222 are formed over and partially wrapped around the fin structures 211-212 (e.g., in the manner described above with reference to FIG. 2). In the illustrated embodiment, a portion of the gate structure 221 is also located partially over the isolation structure 230. In other words, a portion of the gate structure 221 is located over the fin structure 212, while another portion of the gate structure 221 is located over the isolation structure 230. However, it is understood that this is merely a non-limiting example, and that the gate structure 221 (or the gate structure 222) is not required to be formed partially over the isolation structure 230 in other embodiments.

The source/drain contact 243 (including the protruding segment 243A) is formed on the source/drain region 400, so as to provide electrical connectivity to the source/drain region 400. The source/drain contact 243 (and the protruding segment 243A) is formed between two of the adjacent gate structures 221-222 (or between gate structures 220 and 222). As discussed above, the gate structures 220-222 may be HKMG structures. For example, the gate structures 220-222 may include a gate dielectric layer 410 that contains a high-k dielectric material (e.g., a material having a dielectric constant greater than about 4). It is understood that the gate dielectric layer 410 may also include (or is formed over) an interfacial layer (IL), which may include silicon oxide as a non-limiting example. For reasons of simplicity, the IL is not separately shown herein.

The gate structures 220-222 may also each include a metal gate electrode. The metal gate electrode includes one or more work function metal layers 420 and a fill metal component 430. The work function metal layers 420 are configured to tune a work function of the respective transistor device so that a desired threshold voltage Vt is achieved. In some embodiments, the work function metal layers 420 contain: TiAl, TiAlN, TaCN, TiN, WN, or W, or combinations thereof. The fill metal component 430 of the metal gate electrode serves as the main conductive portion of the metal gate electrode. The fill metal component 430 may include tungsten, aluminum, copper, or combinations thereof. The fill metal component 430 may serve as the main conductive portion of the metal gate electrode.

In some embodiments, the gate structures 221-222 are formed by a gate replacement process, in which dummy gates are removed and replaced by the gate dielectric layers 410, the work function metal layers 420, and the fill metal components 430. As such, the gate dielectric layers 410 and the work function metal layers 420 may each have a U-shape in the cross-sectional view, since they may be formed by partially filling the openings as a result of the removal of the dummy gate structures.

The gate structures 221-222 are surrounded by one or more dielectric materials 450. Some of the dielectric materials 450 may include gate spacers that are formed on the sidewalls of the gate structures 221-222. Portions of the dielectric materials 450 may also be disposed over the gate structures 221-222 for protection and/or electrical insulation of the gate structures 221-222. In some embodiments, the dielectric materials 450 include silicon nitride (SiN). The dielectric materials 450 may also be laterally surrounded by the ILD 260. The ILD 280 is disposed over the dielectric materials 450.

As discussed above, a unique physical characteristic of the SRAM cell array 200 of the present disclosure is the shape or profile of the source/drain contact 243, which has the protruding segment 243A. As is shown in FIG. 5, the protruding segment 243A protrudes in the X-direction and has a portion that is in physical contact with an upper surface of the gate structure 221, for example at least partially with the upper surfaces of the work function metal layers 420 and/or with the upper surfaces of the fill metal component 430. As such, the protruding segment 243A (and therefore the source/drain contact 243) is electrically connected to the gate structure 221. The protruding segment 243A has an asymmetrical cross-sectional profile, since its "right" portion protrudes outwardly in the X-direction, but its "left" portion does not. Meanwhile, the rest of the source/drain contact 243—as shown in FIG. 6—is substantially symmetrical and does not have a portion that protrudes substantially outwardly in the X-direction. Thus, the rest of the source/drain contact 243 is free of being in physical contact with the gate structures 220, 221, or 222.

Since the protruding segment 243A of the source/drain contact 243 is now used to provide electrical connectivity to the gate structure 221, it eliminates the need for a butted contact to be separately formed in the ILD 280 to electrically couple the source/drain contact 243 and the gate structure 221 together. Advantageously, replacing the butted contact with the unique source/drain contact 243 herein allows the metal lines formed thereover to be enlarged laterally in the X-direction, which reduces electrical resistance of the metal line. As discussed above, the reduction in electrical resistance may improve SRAM device performance, for example with respect to Vmin. In addition, since the butted contact no longer needs to be formed, the fabrication of the SRAM cell array 200 herein is easier, because it has one fewer process step. The simplification of fabrication processing may also lead to fewer defects and reduced costs. Furthermore, the larger footprint of the source/drain contact 243 (due to the protruding segment 243A) improves its "landing window" in fabrication.

FIGS. 7-14 are a series of cross-sectional drawings (in the X-Z plane) that illustrate the fabrication steps used to form the source/drain contacts 243-244 with protruding segments 243A-244A according to an embodiment of the present disclosure. The cross-sections are taken at the cutline B-B' of FIG. 3.

Figure 7:
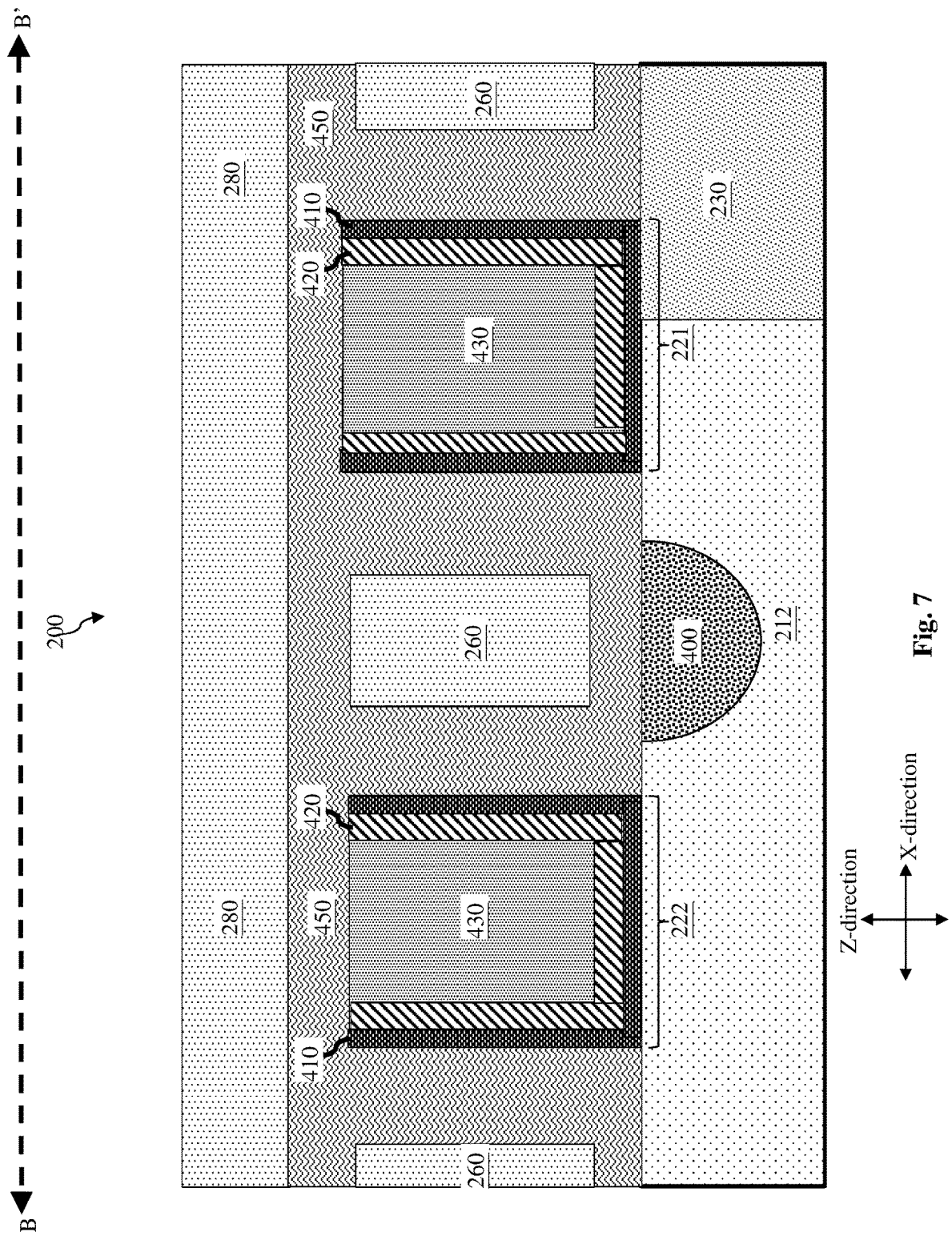

Referring now to FIG. 7, the SRAM cell array 200 has already formed the source/drain region 400 and the gate structures 221-222. The dielectric materials 450 and the ILD 260 surround the gate structures 221-222, and the ILD 280 is formed over the dielectric materials 450.

Figure 8:
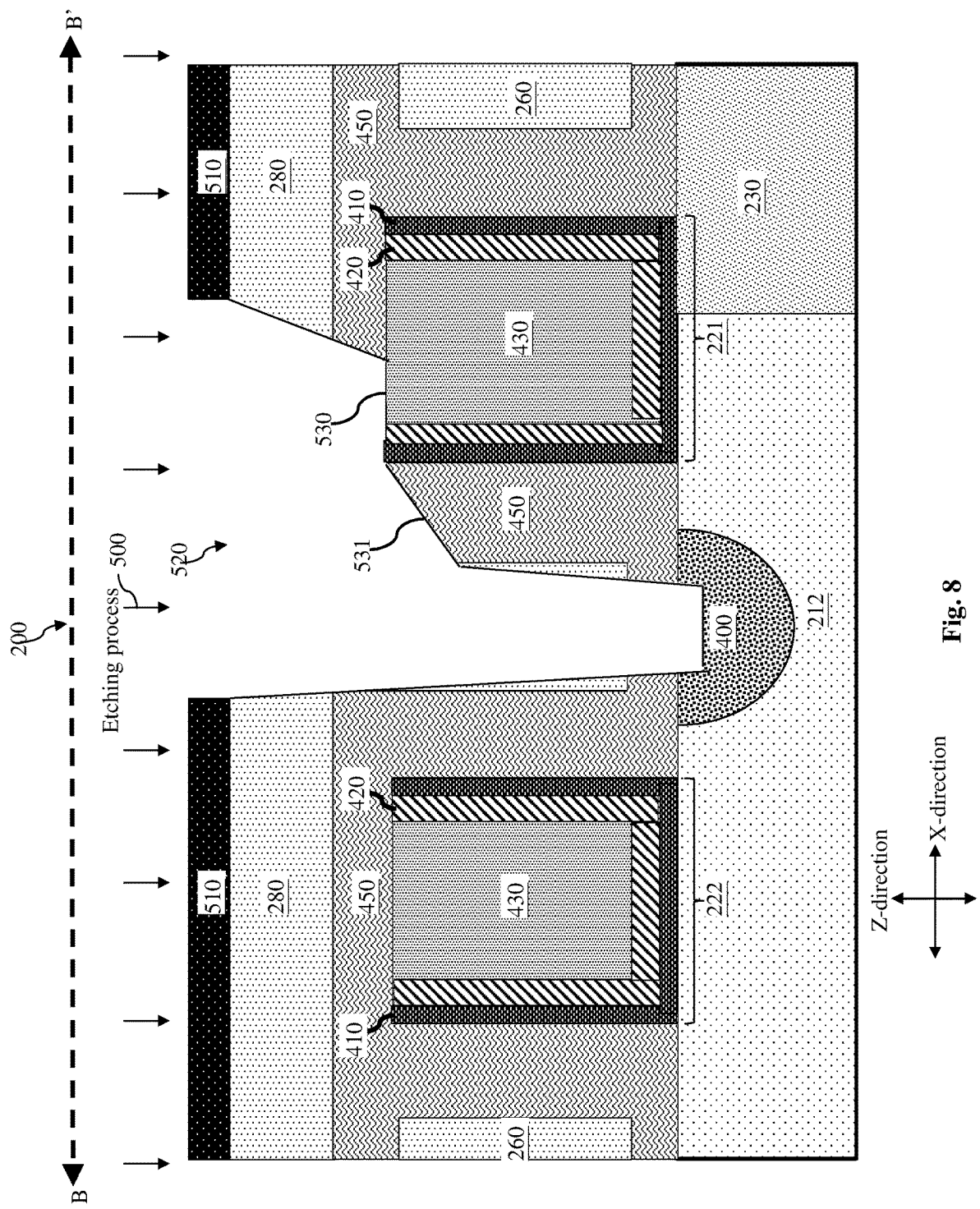

Referring now to FIG. 8, an etching process 500 such as a dry etching process is performed to the SRAM cell array 200. For example, a patterned hard mask layer 510 may be formed over the ILD 280. The patterned hard mask layer 510 may be defined by a lithography process that includes one or more photoresist coating (e.g., spin-on coating), soft baking, mask aligning, exposure, post-exposure baking, developing the photoresist, rinsing, and drying (e.g., hard baking) processes (not necessarily performed in this order). It is understood that the patterned hard mask layer 510 is used to define the location, size, and/or shape of the opening 520 (and therefore the location, size, and/or shape of the source/drain contact to be formed in the opening 520).

The etching process 500 forms an opening 520 that extends vertically through the ILD 280, the dielectric materials 450, the ILD 260, and partially into the source/drain region 400. The patterned hard mask layer 510 protects the portions of the layers therebelow during the etching process 500. The opening 520 exposes a portion of the gate structure 221. The etching process 500 is configured to have etching selectivity between the materials of the gate structure and the ILDs 260 and 280 and the dielectric materials 450, so that the ILDs 260 and 280 and the dielectric materials 450 (e.g., much faster etching rates for the ILDs 260 and 280 and the dielectric materials 450 than for the gate structure 221) can be removed without substantially affecting the gate structure 221. In addition, the ILDs 260 and 280 may be etched substantially faster than the dielectric materials 450 during the etching process 500. Due to these different etching rates, the portion of the upper surface 530 of the gate structure 221 is substantially flatter than the upper surface 531 of the dielectric materials 450 exposed by the opening 520. In other words, the upper surface 531 is more slanted than the upper surface 530.

Figure 9:
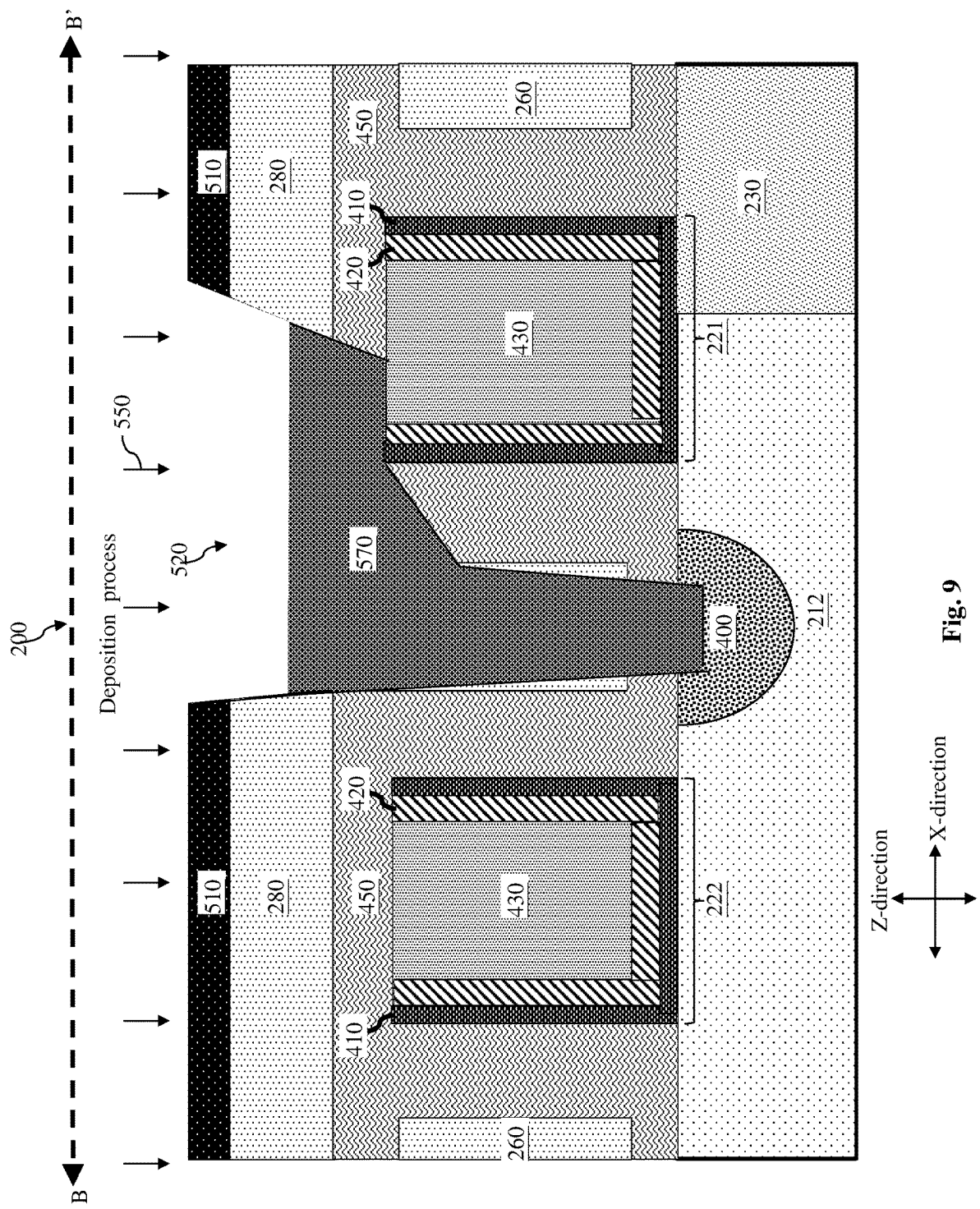

Referring now to FIG. 9, a deposition process 550 is performed to form a protection layer 570 in the opening 520. The deposition process 550 may include CVD, PVD, ALD, HDPCVD, MOCVD, RPCVD, PECVD, or other suitable deposition techniques. The protection layer 570 may include a polymer material in some embodiments. Note that the protection layer 570 need not completely fill the opening 520, though an upper surface 580 of the protection layer 570 is located above (or more elevated than) the upper surface 530 of the gate structure 221. This is so that the protection layer 570 can protect the gate structure 221 in one or more processes to be performed later. Conventional methods of fabricating SRAM devices do not include the formation of the protection layer 570.

Figure 10:
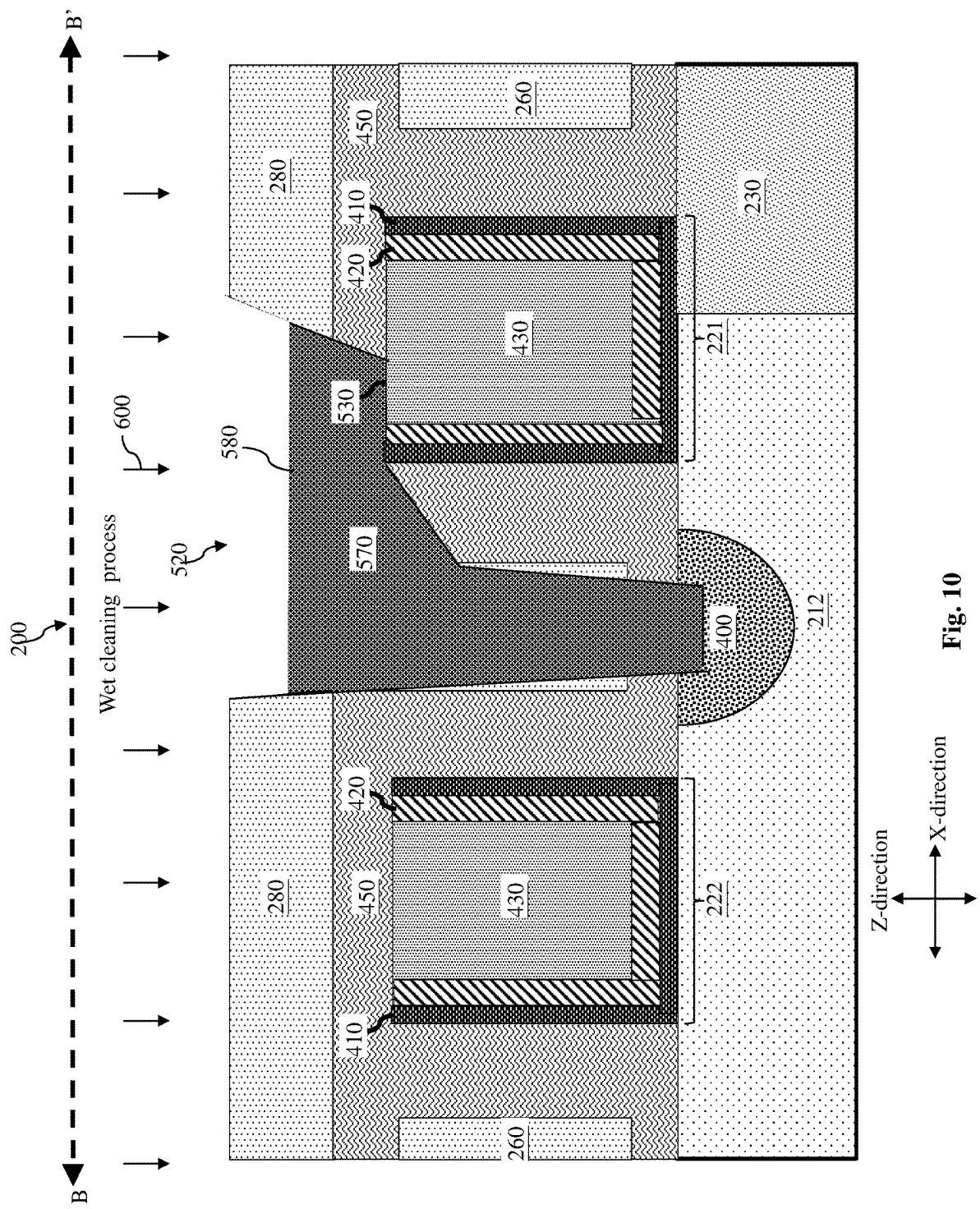

Referring now to FIG. 10, a wet cleaning process 600 is performed to the SRAM cell array 200 to remove the patterned hard mask layer 510. In some embodiments, the wet cleaning process 600 may include apply a halogen-containing fluid to remove the patterned hard mask layer 510. In some embodiments, the halogen-containing fluid may include HF, $F_2$, HCl, $Cl_2$, HBr, or combinations thereof.

The protection layer 570 can protect the gate structure 221 during the wet cleaning process 600. For example, if the protection layer 570 had not been formed already, the wet cleaning process 600 could have at least partially removed the gate dielectric layer 410 (and/or possibly the layers of the metal gate electrode). By forming the protection layer 570 prior to the wet cleaning process 600, the present disclosure protects the gate structures such as the gate structure 221 from being damaged.

Figure 11:
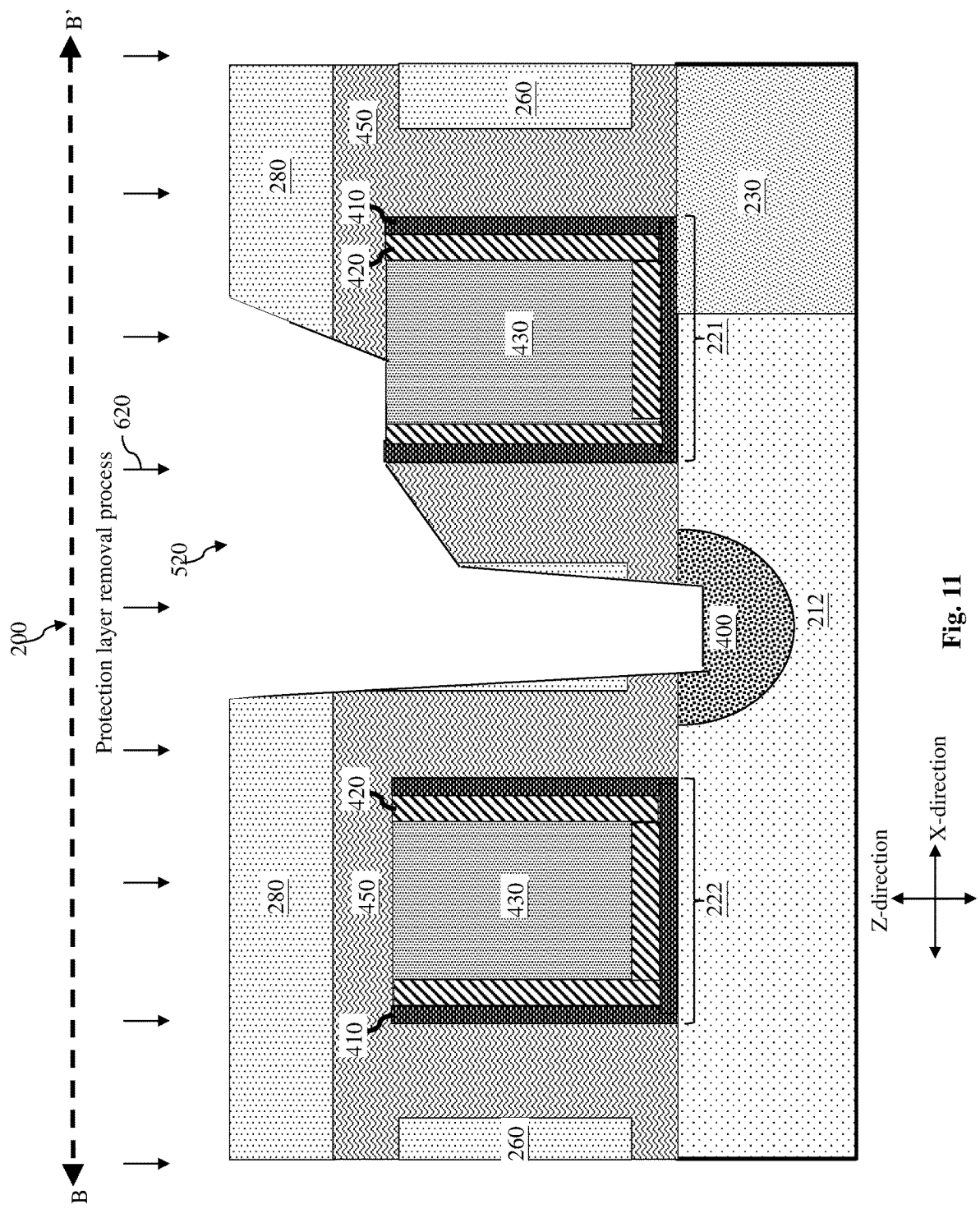

Referring now to FIG. 11, a protection layer removal process 620 is performed to the SRAM cell array 200 to remove the protection layer 570. In some embodiments, the protection layer removal process 620 removes the protection layer 570 using a dry etching process. The dry etching process includes utilizing an oxygen-containing gas, a hydrogen-containing gas, and/or a hydrogen-containing gas to form plasma. The protection layer 570 is removed because it has already served its purpose (e.g., to protect the gate structure 221 during the wet cleaning process 600) and is no longer needed for subsequent processing. In addition, the removal of the protection layer 570 will free up space in the opening 520 such that it can be filled with a conductive material layer to form the source/drain contact.

Figure 12:
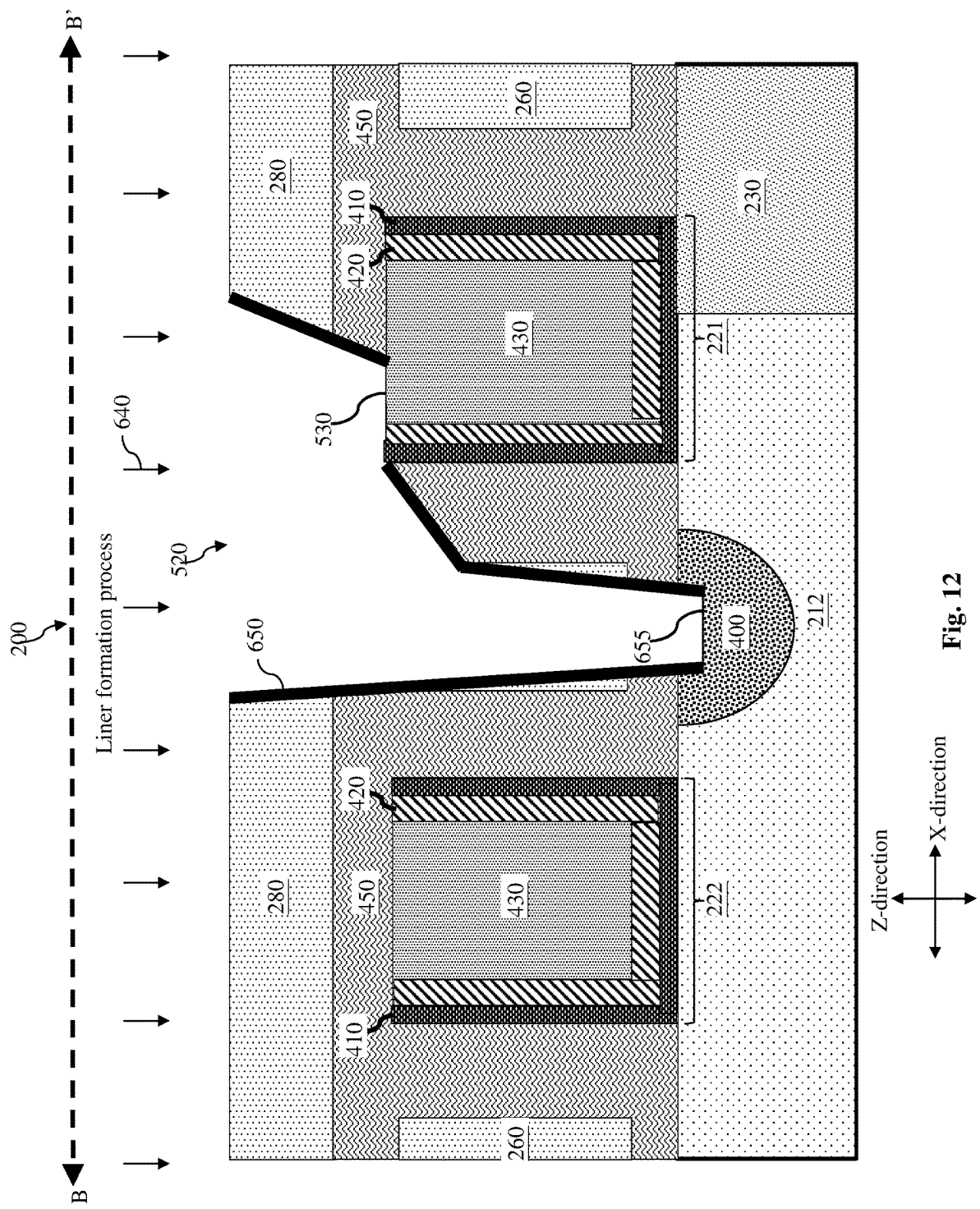

Referring now to FIG. 12, a liner formation process 640 is performed to form a liner 650 in the opening 520. The liner formation process 640 may include a deposition process to deposit a liner material on the surfaces of the various layers exposed by the opening 520. Note that the liner 650 was not specifically shown in FIG. 5 discussed above for reasons of simplicity. In some embodiments, the liner material may include a dielectric material, such as silicon nitride. The liner formation process 640 may also include an etching process to etch away the portion of the liner 650 disposed over the gate structure 221 and over the source/drain region 400. This allows the upper surface 530 of the gate electrode (e.g., the work function metal layers 420 and the fill metal component 430) and an upper surface 655 of the source/drain region 400 to remain exposed, so that a subsequently formed source/drain contact filling the opening 520 can be in physical and electrical contact with the gate electrode and the source/drain region 400. Note that the patterned hard mask layer 510 may also be removed before or after the liner formation process 640 in some embodiments.

Figure 13:
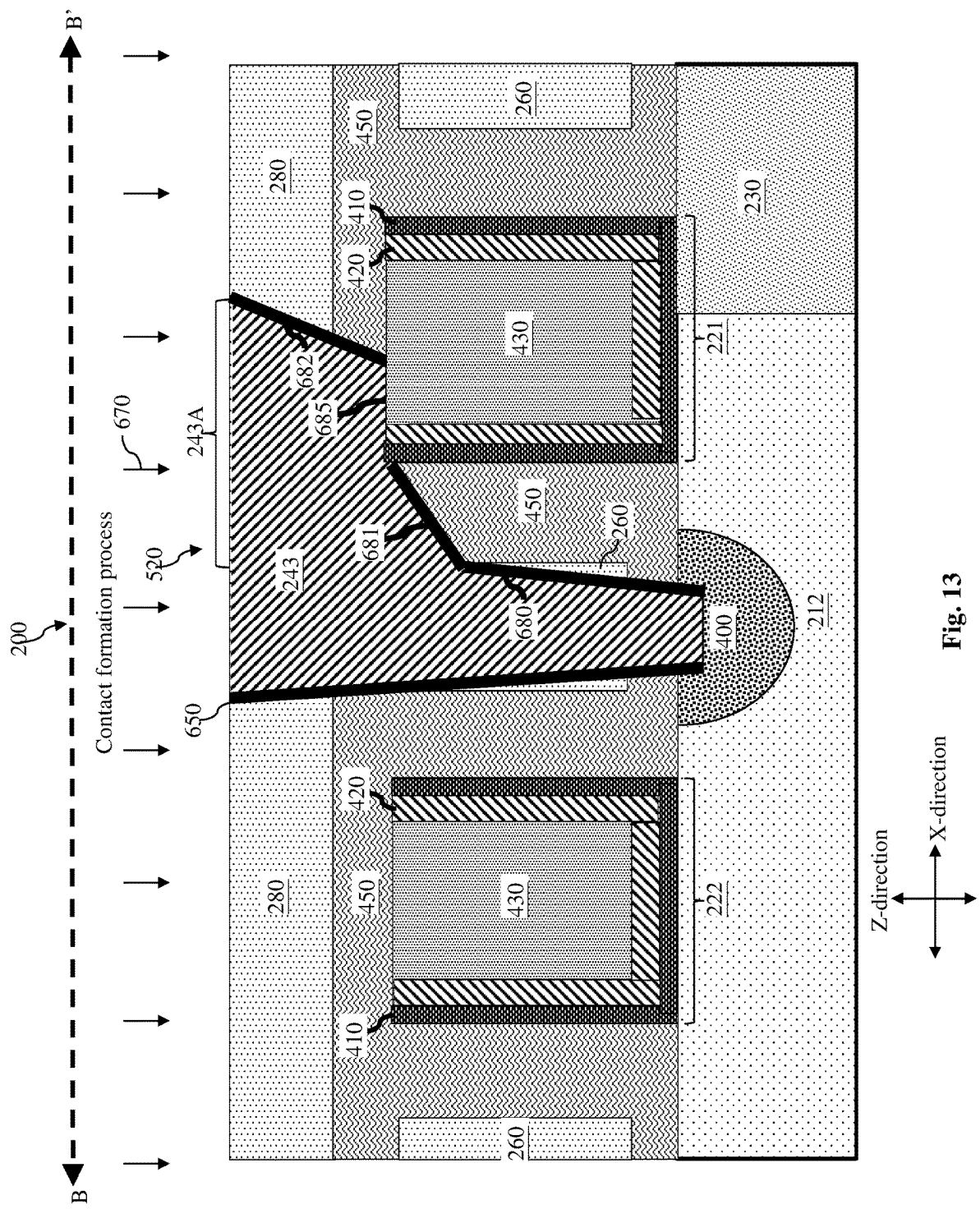

Referring now to FIG. 13, a contact formation process 670 is performed to form the source/drain contact 243 in the opening 520. The protruding segment 243A of the source/drain contact 243 is shown in the cross-sectional view of FIG. 13. The contact formation process 670 may include one or more deposition processes to deposit a conductive material in the opening 520, such as cobalt, copper, aluminum, tungsten, or combinations thereof. The deposited conductive material completely fills the opening 520 and may even be deposited on the top surfaces of the ILD 280. The contact formation process 670 may also include a planarization process (e.g., a CMP process) to remove the portions of the conductive material outside of the opening 520 and to planarize the upper surfaces of the deposited conductive material and the ILD 280. The remaining portion of the conductive material in the opening 520 forms the source/drain contact 243.

In additional to having a unique top view profile, the source/drain contact 243 also has a unique cross-sectional view profile. For example, the source/drain contact 243 is asymmetrical in the cross-sectional view of FIG. 13, since the protruding segment 243A protrudes out in the X-direction. As a result of the unique fabrication processing flow used to form the source/drain contact 243, the source/drain contact 243 has a plurality of slanted sidewalls 680, 681, and 682 (also referred to as side surfaces). At least some of the slanted sidewalls 680-682 are slanted at different angles compared to one another. For example, the sidewall 680 and the sidewall 681 may be slanted at different angles, and the sidewall 681 and the sidewall 682 may also be slanted at different angles. The sidewall 681 and the sidewall 682 are joined together by a surface 685 of the source/drain contact 243, which is substantially flatter than the sidewalls 680-682. The surface 685 is flatter more planarized due to the etching selectivity between the gate structure 221 and the ILD 260 and the dielectric materials 450 when the opening 520 for the source/drain contact 243 was etched (see the etching process 500 of FIG. 8).

Also note that the slanted sidewalls 680-682 are in physical contact with the liner 650, but the surface 685 is not. Had the liner 650 not been present, the sidewall 680 would have been in physical contact with the ILD 260, the sidewall 681 would have been in physical contact with the dielectric material 450 (e.g., gate spacers), and the sidewall 682 would have been in physical contact with the dielectric material 450 and with the ILD 280.

Since the source/drain contact 243 has a laterally-protruding profile and protrudes partially over the gate structure 221, the source/drain contact 243 electrically interconnects the source/drain region 400 and the gate structure 221 together. As such, the source/drain contact 243 effectively replaces the functionalities of a butted contact that would have been implemented in conventional SRAM cell arrays. As discussed above, the removal of the butted contact allows the metal lines formed over the ILD 280 to be enlarged laterally. The lateral enlargement of the metal lines helps to reduce the parasitic electrical resistance of the metal lines, since resistance is inversely correlated with the width (or lateral dimension) of a metal line. The reduction in resistance is very helpful as SRAM devices are fabricated in increasingly small technology nodes (e.g., a 5-nanometer node or smaller nodes), since parasitic resistance is more pronounced for these devices with smaller and smaller geometries. If left unabated, the parasitic resistance for metal lines (e.g., serving as bit lines of an SRAM) may reach a point where a voltage drop across the length of the metal line can cause a significant undesirable voltage degradation. This situation is compounded by the fact that the metal lines may continuously extend across many cells of the SRAM cell array 200 in the X-direction. The distant cells at the far "end" of the SRAM cell array would experience the greatest unintentional (and undesirable) voltage drop due to the fact that they are associated with the largest parasitic resistance, since the longer the length of the metal line, the larger the parasitic resistance.

As a non-limiting example, the voltage drop across the length of the metal line may worsen the Vmin of an SRAM cell. Vmin may be the lowest voltage at which an SRAM cell can be read. However, the voltage drop due to parasitic resistance across the length of the metal lines may cause Vmin to be too high, which may cause the transistors of the SRAM cell to not be turned on (and thus the SRAM cannot be read). The present disclosure can achieve a reduction in the resistance of the metal lines by giving the metal lines a greater amount of room for expansion, since the elimination of the butted contact means that the expansion of the metal line is not restricted by the location of the butted contact. Accordingly, the larger metal line leads to reduced parasitic resistance and improved SRAM device performance.

Figure 14:
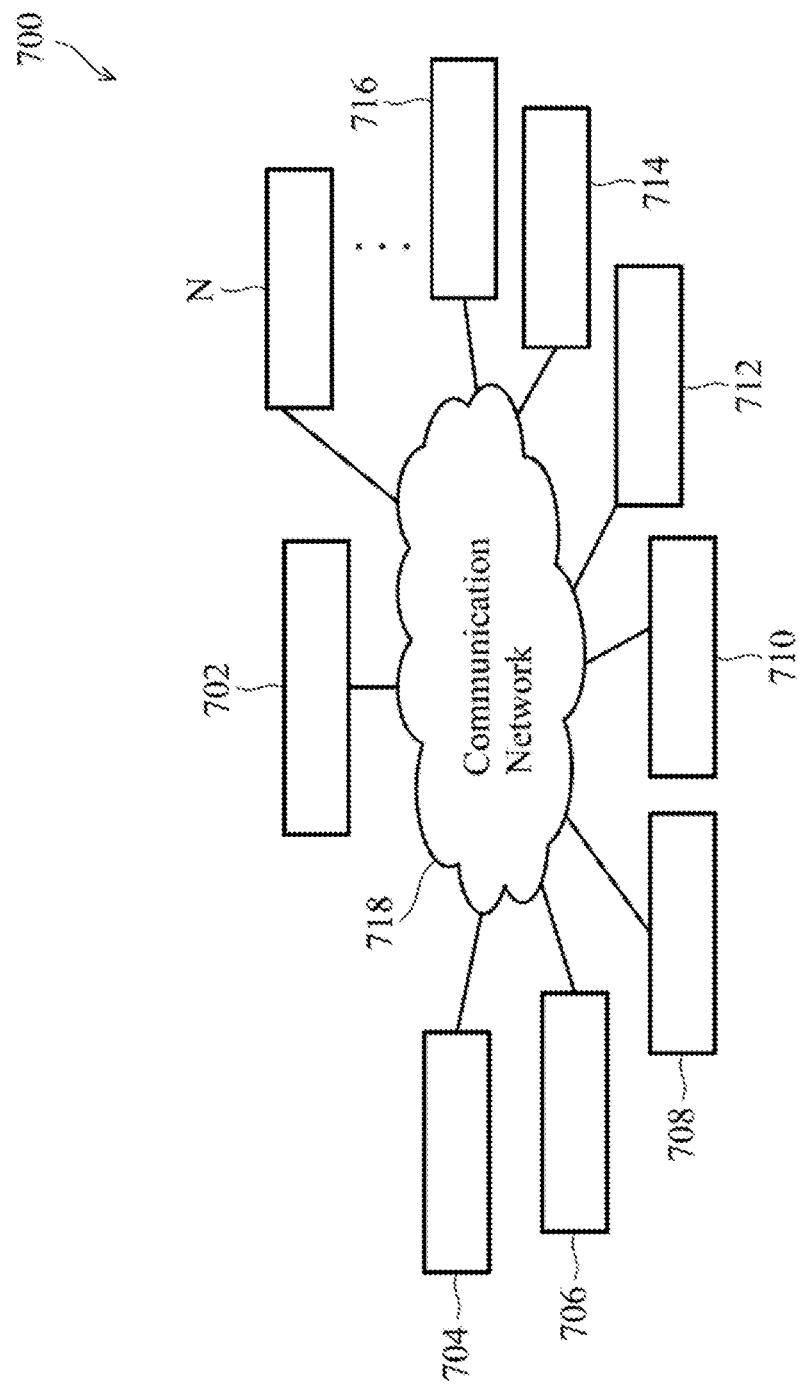
FIG. 14 illustrates an integrated circuit fabrication system according to an embodiment of the present disclosure.

FIG. 14 illustrates an integrated circuit fabrication system 700 according to embodiments of the present disclosure. The fabrication system 700 includes a plurality of entities 702, 704, 706, 708, 710, 712, 714, 716 . . . , N that are connected by a communications network 718. The network 718 may be a single network or may be a variety of different networks, such as an intranet and the Internet, and may include both wire line and wireless communication channels.

In an embodiment, the entity 702 represents a service system for manufacturing collaboration; the entity 704 represents an user, such as product engineer monitoring the interested products; the entity 706 represents an engineer, such as a processing engineer to control process and the relevant recipes, or an equipment engineer to monitor or tune the conditions and setting of the processing tools; the entity 708 represents a metrology tool for IC testing and measurement; the entity 710 represents a semiconductor processing tool, such an EUV tool that is used to perform lithography processes to define the irregularly shaped metal lines of an SRAM device; the entity 712 represents a virtual metrology module associated with the processing tool 710; the entity 714 represents an advanced processing control module associated with the processing tool 710 and additionally other processing tools; and the entity 716 represents a sampling module associated with the processing tool 710.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 714 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 700 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 700 may enable collaboration and information access in such areas as design, engineering, and processing, metrology, and advanced processing control. Another capability provided by the IC fabrication system 700 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 15 is a flowchart illustrating a method 800 of fabricating a semiconductor device. The method 800 includes a step 810 to provide a semiconductor device. The semiconductor device includes: a fin structure, a source/drain region formed on the fin structure, a gate structure that at least partially wraps around the fin structure, and dielectric materials formed over the source/drain region and over the gate structure.

The method 800 includes a step 820 to perform an etching process to the semiconductor device. The etching process forms an opening that extends through the dielectric materials and at least partially exposes both the source/drain region and the gate structure. In some embodiments, the etching process is configured to have an etching selectivity between the gate structure and the dielectric materials such that the dielectric materials are etched at a substantially faster rate than the gate structure. In some embodiments, the opening is etched to have an "L"-like shape in a top view.

The method 800 includes a step 830 to form a protection layer to partially fill the opening. In some embodiments, a polymer layer is formed as the protection layer. In some embodiments, the protection layer is formed such that an upper surface of the protection layer is disposed above an upper surface of the gate structure.

The method 800 includes a step 840 to perform a wet cleaning process to the semiconductor device after the protection layer has been formed.

The method 800 includes a step 850 to remove the protection layer after the wet cleaning process has been performed.

The method 800 includes a step 860 to fill the opening with a conductive material that electrically couples the gate structure and the source/drain region together.

In some embodiments, the gate structure is a first gate structure, and the semiconductor device further includes a second gate structure. The first gate structure and the second gate structure are formed on opposite sides of the source/drain region. In some embodiments, the etching process is performed without exposing the second gate structure to the opening.

It is understood that the method 800 may include additional steps that may be performed before, during, or after the steps 810. For example, the method 800 may include a step to form a dielectric liner on side surfaces of the opening, which may be performed before the step 860 to fill the opening. The conductive material is formed on the dielectric liner. Other steps may include formation of interconnect layers, packaging, testing, etc. For reasons of simplicity, these additional steps are not discussed herein in detail.

In summary, the present disclosure replaces butted contacts in conventional devices with uniquely shaped source/drain contacts. For example, whereas conventional SRAM cell arrays may use a butted contact—which may be a contact formed in an ILD—to electrically interconnect a source/drain and a gate, the present disclosure omits the formation of such butted contacts. Instead, the present disclosure carefully configures the shape/profile of a source/drain contact such that it has a protruding segment that protrudes toward a gate and that makes physical contact with the upper surface of the gate. As such, the source/drain contact of the present disclosure may be configured to have an "L"-like shape or profile in a top view, and an asymmetrical profile (due to the protruding segment) in a cross-sectional view.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is improved device performance. For example, as device size scaling down continues, the parasitic resistance of metal lines may play a significant role in causing an undesirable voltage loss along the length of the metal line. This is exacerbated when the metal line is long, which may be the case when the metal line is used to carry SRAM signals such as bit line or bit line bar. In order to minimize parasitic electrical resistance of the metal line by enlarge the metal line laterally (i.e., increasing its width). However, the presence of the butted contacts in conventional devices effectively places a limit on the enlargement of the metal line, because as the metal line is enlarged, it may increase an electrical bridging (e.g., shorting) risk with the butted contact. The present disclosure obviates this problem by not forming the butted contacts, which allows much more room for the metal line to expand laterally, and this in turning reduces the parasitic resistance of the metal lines and optimizes device performance, for example with respect to a minimum operating voltage. Another advantage is a better landing window of the source/drain contact due to its larger size. Yet another advantage is its compatibility with existing fabrication processes and low cost of implementation, since the formation of the unique source/drain contact herein may be achieved by configuring the source/drain contact mask pattern design.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure pertains to a semiconductor device. The semiconductor device includes a fin structure. A source/drain region is formed on the fin structure. A first gate structure is disposed over the fin structure. A source/drain contact is disposed over the source/drain region. The source/drain contact has a protruding segment that protrudes at least partially over the first gate structure. The source/drain contact electrically couples together the source/drain region and the first gate structure.

Another aspect of the present disclosure pertains to a semiconductor device. The semiconductor device includes a fin structure that contains a semiconductive material. The semiconductor device includes a source/drain formed on the fin structure. The semiconductor device includes a gate formed over the fin structure. The semiconductor device includes a source/drain contact that is physically connected to both the source/drain and the gate, wherein the source/drain contact has an asymmetric profile.

Yet another aspect of the present disclosure includes a method. A semiconductor device is provided that includes: a fin structure, a source/drain region formed on the fin structure, a gate structure that at least partially wraps around the fin structure, and dielectric materials formed over the source/drain region and over the gate structure. An etching process is performed to the semiconductor device. The etching process forms an opening that extends through the dielectric materials and at least partially exposes both the source/drain region and the gate structure. The opening is filled with a conductive material that electrically couples the gate structure and the source/drain region together.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
a fin structure;
a source/drain region formed on the fin structure;
a first gate structure disposed over the fin structure; and
a source/drain contact disposed over the source/drain region, wherein the source/drain contact has a protruding segment that protrudes at least partially over the first gate structure, wherein the source/drain contact electrically couples together the source/drain region and the first gate structure;
wherein
a majority portion of the source/drain contact extends in a first direction in a top view; and
the protruding segment protrudes away from the majority portion in a second direction that is different from the first direction in the top view.

2. The semiconductor device of claim 1, further comprising a second gate structure;
wherein:
the source/drain contact is disposed between the first gate structure and the second gate structure but is not in physical contact with the second gate structure; and
the fin structure, the source/drain region, the first gate structure, the second gate structure, and the source/drain contact are components of a Static Random Access Memory (SRAM) cell.

3. The semiconductor device of claim 1, wherein the source/drain contact has an "L"-like top view profile.

4. The semiconductor device of claim 1, wherein the source/drain contact includes a plurality of slanted sidewalls in a cross-sectional view.

5. The semiconductor device of claim 4, wherein at least some of the slanted sidewalls are slanted at different angles.

6. The semiconductor device of claim 4, further comprising: a dielectric liner that is disposed on the slanted sidewalls of the source/drain contact.

7. The semiconductor device of claim 1, wherein:
the protruding segment has a first dimension measured in the second direction;
the first gate structure has a second dimension measured in the second direction;
the first gate structure is spaced apart from the majority portion by a distance in the second direction;
the first dimension is greater than a sum of: the distance and 2 of the second dimension; and
the first dimension is less than a sum of: the distance and the second dimension.

8. The semiconductor device of claim 1, wherein:
the protruding segment has a first dimension measured in the first direction;
the fin structure is spaced apart from an end of the first gate structure by a first distance in the first direction;
the fin structure has a second dimension measured in the first direction;
the fin structure is spaced apart from an adjacent fin structure by a second distance in the first direction;
the first dimension is greater than a sum of: the first distance and the second dimension; and
the first dimension is less than a sum of: the first distance, the second dimension, and ½ of the second distance.

9. A semiconductor device, comprising:
a fin structure that contains a semiconductive material;
a source/drain formed on the fin structure;
a gate formed over the fin structure; and
a source/drain contact that is physically connected to both the source/drain and the gate, wherein the source/drain contact has a first asymmetric profile in a top view and a second asymmetric profile in a cross-sectional view.

10. The semiconductor device of claim 9, wherein the first asymmetric profile or the second asymmetric profile is attributed to a portion of the source/drain contact that protrudes toward the gate and is physically and electrically connected to the gate.

11. The semiconductor device of claim 9, wherein the fin structure extends in a first direction in the top view, wherein the gate extends in a second direction different from the first direction in the top view, wherein the source/drain contact has a majority portion that extends in the second direction in the top view, and wherein the source/drain contact has a minority portion that extends in the first direction in the top view, the minority portion including the portion that protrudes toward the gate.

12. The semiconductor device of claim 9, wherein a portion of the source/drain contact is in direct contact with an upper surface of the gate.

13. The semiconductor device of claim 9, wherein the fin structure, the source/drain, the gate, and the source/drain contact are components of a Static Random Access Memory (SRAM) cell.

14. The semiconductor device of claim 9, wherein the first asymmetric profile resembles a letter "L" in the top view.

15. The semiconductor device of claim 9, wherein the source/drain contact has a plurality of slanted sidewalls that are slanted at different angles.

16. A semiconductor device, comprising:
a fin structure that contains a semiconductor material, wherein the fin structure extends in a first direction in a top view;
a source/drain component disposed over the fin structure in a side view;
a gate component disposed over the fin structure in the side view, wherein the gate component extends in a second direction in the top view; and
a source/drain contact disposed over the source/drain component and the gate component and electrically interconnects the source/drain component with the gate component, wherein a majority segment of the source/drain contact extends in the second direction in the top view, and wherein a minority segment of the source/drain contact protrudes away from the majority segment and toward the gate component in the first direction.

17. The semiconductor device of claim 16, wherein:
a first bottom surface of the source/drain contact is in direct contact with the source/drain component; and
a second bottom surface of the source/drain contact is in direct contact with the gate component.

18. The semiconductor device of claim 16, wherein the source/drain contact has a plurality of slanted side surfaces that are each slanted at different angles.

19. The semiconductor device of claim 16, wherein the source/drain contact has a first asymmetric profile in a top view and a second asymmetric profile in a cross-sectional view.

20. The semiconductor device of claim 19, wherein the first asymmetric profile is shaped similar to a letter "L" in the top view.

* * * * *